(12) United States Patent
Zheng et al.

(10) Patent No.: US 11,523,517 B2
(45) Date of Patent: Dec. 6, 2022

(54) CIRCUIT BOARD AND METHOD FOR MANUFACTURING THE SAME

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Ying-Qiu Zheng, Shenzhen (CN); Chao Peng, Shenzhen (CN); Xian-Qin Hu, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 212 days.

(21) Appl. No.: 17/038,244

(22) Filed: Sep. 30, 2020

(65) Prior Publication Data
US 2022/0046802 A1  Feb. 10, 2022

(30) Foreign Application Priority Data

Aug. 10, 2020  (CN) .......................... 202010797851.9

(51) Int. Cl.
*H05K 1/00* (2006.01)
*H05K 3/00* (2006.01)
(Continued)

(52) U.S. Cl.
CPC ............. *H05K 3/246* (2013.01); *H05K 1/095* (2013.01); *H05K 3/067* (2013.01); *H05K 3/4069* (2013.01);
(Continued)

(58) Field of Classification Search
CPC .......... H05K 1/00; H05K 1/056; H05K 1/095; H05K 3/00; H05K 3/28; H05K 3/42; H05K 3/46; H05K 3/067; H05K 3/244; H05K 3/246; H05K 3/361; H05K 3/365; H05K 3/421; H05K 3/4069; H05K 3/4664; G03F 7/20; G03F 7/032; G03F 7/037
USPC ........ 174/257, 254, 262; 525/420, 423, 424, 525/425, 454, 534, 540; 29/829, 847, 29/853
See application file for complete search history.

(56) References Cited

U.S. PATENT DOCUMENTS 6,008,877 A * 12/1999 Akiyama .......... G02F 1/133512
349/147
6,674,017 B1 * 1/2004 Yamasaki .............. H05K 3/421
29/853
(Continued)

FOREIGN PATENT DOCUMENTS

TW          201907770 A        2/2019

*Primary Examiner* — Xiaoliang Chen
(74) *Attorney, Agent, or Firm* — ScienBiziP, P.C.

(57) ABSTRACT

A method for manufacturing a circuit board with narrow conductive traces and narrow spaces between traces includes a base layer and two first wiring layers disposed on opposite surfaces of the base layer. Each first wiring layer includes a first bottom wiring and a first electroplated copper wiring. The first bottom wiring is formed on the base layer. The first bottom wiring includes a first end facing the base layer, a second end opposite to the first end, and a first sidewall connecting the first end and the second end. The first electroplated copper wiring covers the second end and the first sidewall of the first bottom wiring.

8 Claims, 9 Drawing Sheets

(51) Int. Cl.
    *H05K 3/28*         (2006.01)
    *H05K 3/42*         (2006.01)
    *H05K 3/46*         (2006.01)
    *G03F 7/20*         (2006.01)
    *G03F 7/32*         (2006.01)
    *H05K 3/24*         (2006.01)
    *H05K 3/06*         (2006.01)
    *H05K 3/40*         (2006.01)
    *H05K 1/09*         (2006.01)

(52) U.S. Cl.
    CPC ............. *H05K 3/4664* (2013.01); *H05K 3/28* (2013.01); *H05K 2201/0347* (2013.01); *H05K 2201/0379* (2013.01); *H05K 2203/0514* (2013.01); *H05K 2203/0723* (2013.01)

(56) References Cited

U.S. PATENT DOCUMENTS

| | | | | |
|---|---|---|---|---|
| 6,696,529 | B1 * | 2/2004 | Mochizuki | G03F 7/037 525/425 |
| 2008/0236872 | A1 * | 10/2008 | Kataoka | H05K 3/06 29/829 |
| 2009/0044971 | A1 * | 2/2009 | Kataoka | H05K 3/365 174/257 |

* cited by examiner

CIRCUIT BOARD AND METHOD FOR MANUFACTURING THE SAME

FIELD

The subject matter herein generally relates to printed circuit boards, and more particularly, to a circuit board including fine wiring and a method for manufacturing the circuit board.

BACKGROUND

Electronic devices, such as mobile phones, tablet computers, or personal digital assistants, usually have circuit boards. Component \density in such electronic devices is always increasing, but the traces of the wiring layer of the circuit board must also become slimmer. Such circuit board may be manufactured by a subtractive or semi-additive method.

The subtractive method includes steps of electroplating copper on a copper substrate, and etching the electroplated copper and a copper foil of the copper substrate through an exposure and development process to obtain desired wiring patterns. However, the copper wirings applying this subtractive process have undercut during the etching, especially when the wiring patterns need narrow lines width and line space. In addition, the etching process causes a waste of copper, which is toxic.

The semi-additive method includes steps of covering a dry film on the copper substrate, electroplating copper in opening of the dry film, and then etching a portion of the copper foil exposed from the electroplated copper. Although the semi-additive method can avoid the undercut in the copper wirings, the copper electroplating process may also cause pollution in the environment.

Improvement in the art is desired.

BRIEF DESCRIPTION OF THE DRAWINGS

Implementations of the present technology will now be described, by way of embodiment, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 15:
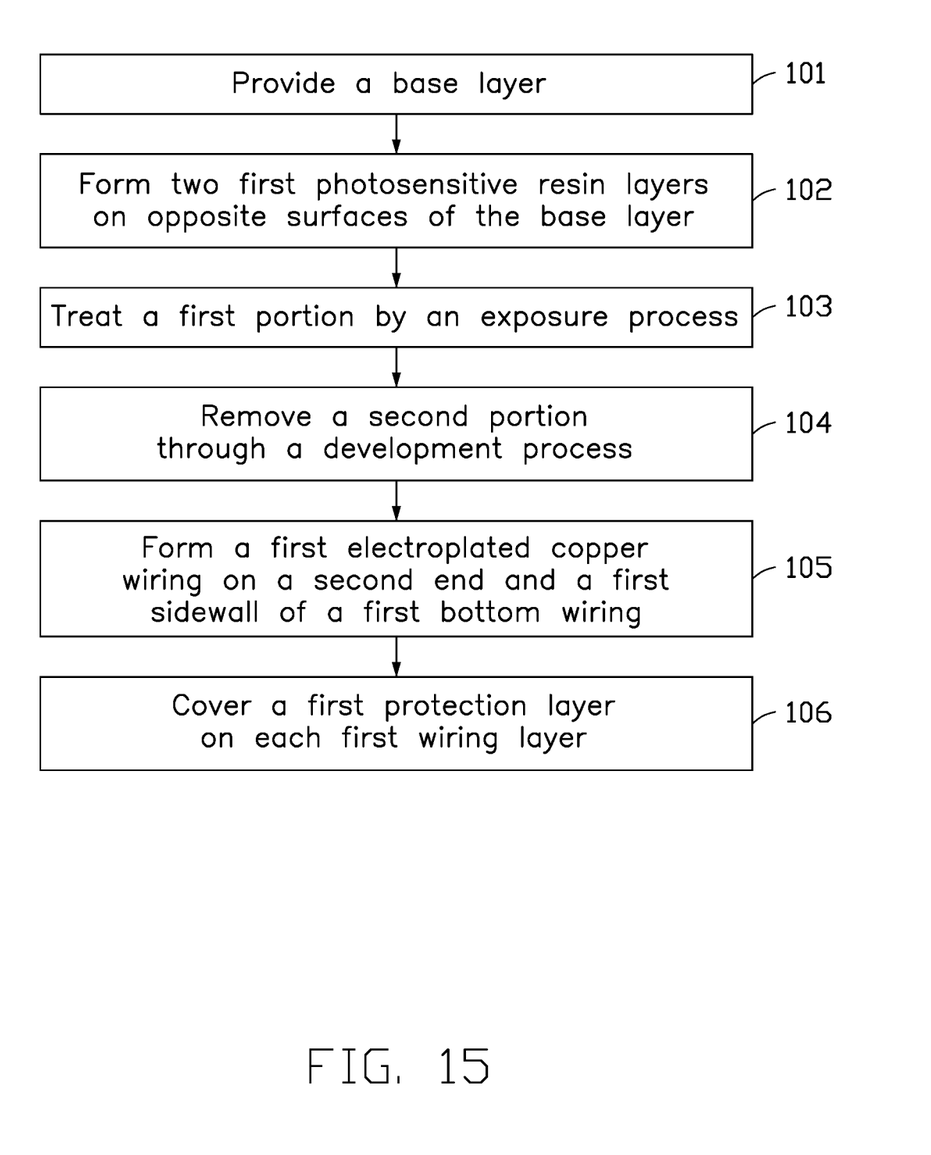
FIG. 15 is a flowchart of an embodiment of a method for manufacturing a multilayer circuit board.

The present disclosure provides a method for manufacturing a circuit board. The method can be used to manufacture a double-sided circuit board and a multilayer circuit board. Referring to FIG. 15, the method for manufacturing a double-sided circuit board is presented in accordance with an embodiment. The method is provided by way of example, as there are a variety of ways to carry out the method. The method can begin at block 11.

Figure 1:
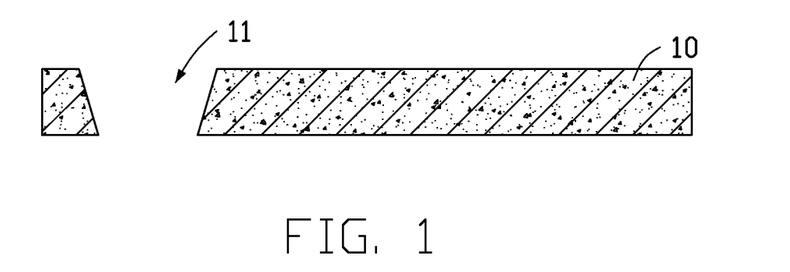
FIG. 1 is a cross-sectional view of an embodiment of a base layer.

In block 101, referring to FIG. 1, a base layer 10 is provided. A first through hole 11 is defined in the base layer 10.

In an embodiment, the base layer 10 is made of an insulating resin, such as epoxy resin, polypropylene (PP), BT resin, and polyphenylene oxide (PPO), polypropylene (PP), polyimide (PI), polyethylene terephthalate (PET), and polyethylene naphthalate (PEN).

The first through hole 11 may be formed by punching or laser drilling.

Figure 2:
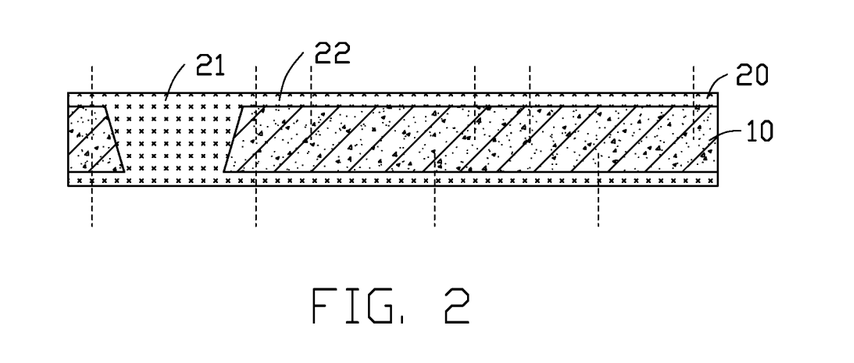
FIG. 2 is a cross-sectional view showing a first photosensitive resin layer formed on the base layer of FIG. 1.

In block 102, referring to FIG. 2, two first photosensitive resin layers 20 are formed on opposite surfaces of the base layer 10 by printing silver paste or pressing photosensitive silver films on the base layer 10. Each first photosensitive resin layer 20 includes a photosensitive resin and silver particles therein. In other embodiments, the first photosensitive resin layer 20 may include the photosensitive resin and other kinds of conductive materials disposed in the photosenstive resin. The conductive materials may be at least one of copper particles, graphene, and carbon nanotubes. Each first photosensitive resin layer 20 is divided into a first portion 21 and a second portion 22 beside the first portion 21. The first portion 21 is designed to correspond to desired wiring patterns.

Referring to FIG. 2, the first photosensitive resin layer 20 also infills the first through hole 11.

Figure 3:
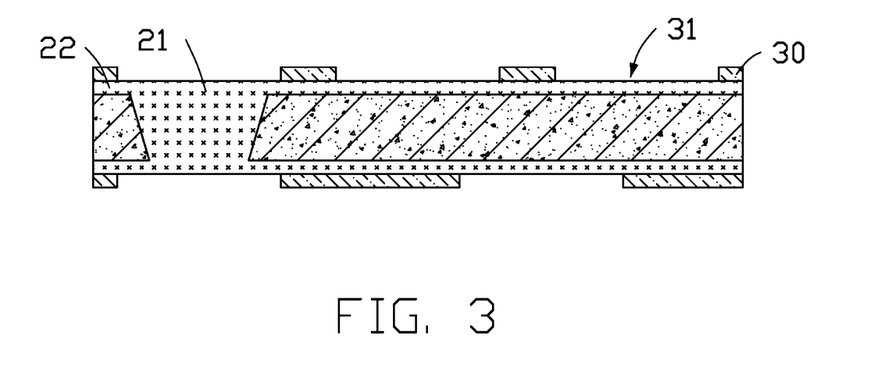
FIG. 3 is a cross-sectional view of the first photosensitive resin layer of FIG. 2 after an exposure process.

In block 103, referring to FIG. 3, the first portion 21 is treated by an exposure process.

In an embodiment, a first photomask 30 covers each first photosensitive resin layer 20. The first photomask 30 has first openings 31 corresponding to the first portion 21. That is, the first portion 21 is exposed from the first photomask 30. The second portion 22 is covered by the first photomask 30. Therefore, when light is emitted toward the first photosensitive resin layer 20, compositions in the first portion 21 are polymerized under the light, causing solidification of the first portion 21. Compositions in the second portion 22 are not polymerized since the second portion 22 is not irradiated by the light (that is, the second portion 22 remains unsolidified).

Figure 4:
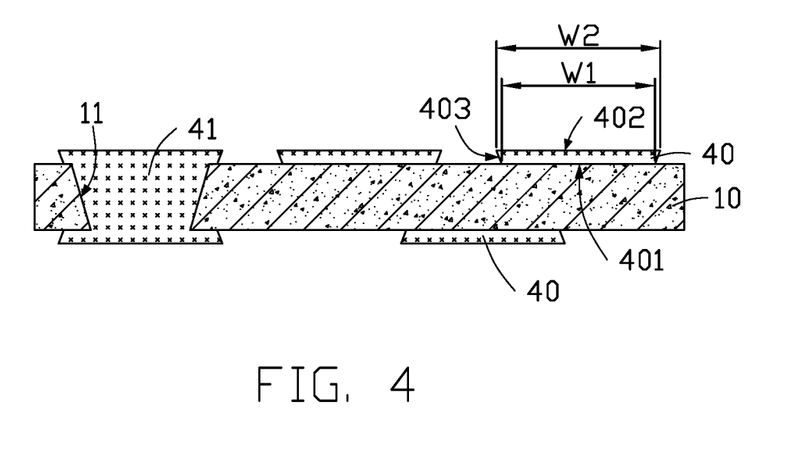
FIG. 4 is a cross-sectional view of the first photosensitive resin layer of FIG. 3 after a development process, to obtain a first bottom wiring.
Figure 5:
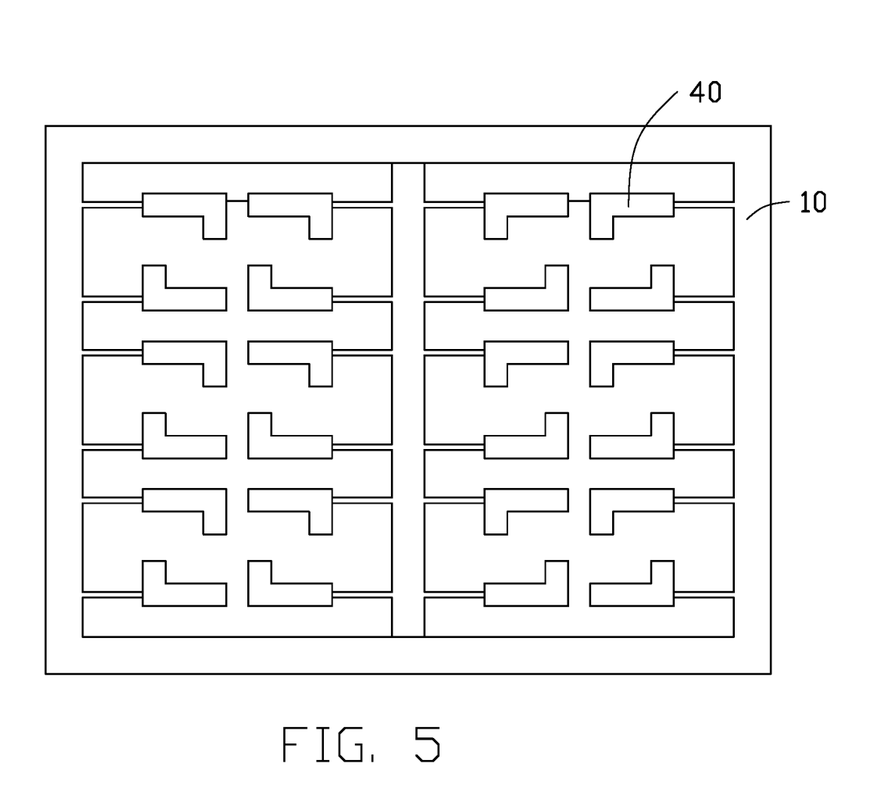
FIG. 5 is a top view of the first bottom wiring of FIG. 4.

In block 104, referring to FIGS. 4 and 5, the second portion 22 is removed through a development process. After drying, two first bottom wirings 40 are obtained. Each first bottom wiring 40 includes a first end 401 facing the base layer 10, a second end 402 opposite to the first end 401, and a first sidewall 403 connecting the first end 401 and the second end 402. In an embodiment, a width $W_2$ of the second end 402 is greater than a width $W_1$ of the first end 401. The width is defined as a dimension of the first end 401 or the second end 402 along the extending direction of the base layer 10.

The second portion 22 may be removed by an alkaline developing solution. The developing solution can include 1% of $NaCO_3$ by amount. The second portion 22 at least is immersed in the developing solution. Since the second portion 22 is not treated by the exposure process, the second portion 22 can react with the developing solution and be removed. The silver particles in the removed second portion 22 can be recycled and reused, saving the costs of raw material.

The first bottom wiring 40 also infills the first through hole 11 to form a first conductive block 41. The first bottom wiring 40 includes a photosensitive resin and the silver particles disposed in the photosensitive resin. The silver particles are electrically conductive, that is, the silver particles render the first conductive block 41 to be electrically conductive.

In other embodiments, the first bottom wiring 40 may also be formed by photolithography.

Figure 6:
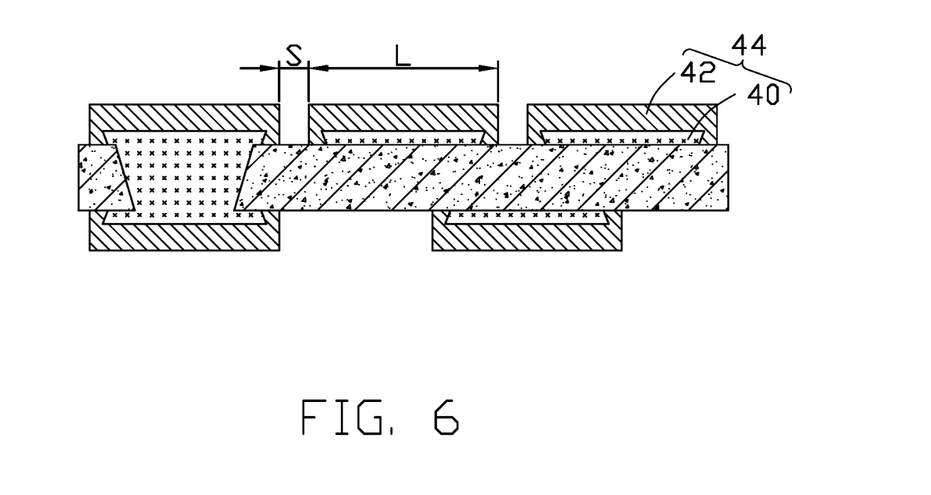
FIG. 6 is a cross-sectional view showing a first electroplated copper wiring formed on the first bottom wiring of FIG. 5, to obtain a first wiring layer.

In block 105, referring to FIG. 6, a first electroplated copper wiring 42 is formed on the second end 402 and the first sidewall 403 of the first bottom wiring 40. The first bottom wiring 40 and the first electroplated copper wiring 42 cooperatively form a first wiring layer 44. The first conducting portion 41 electrically connects the two first wiring layers 44 to each other.

Since the width of the second end 402 is greater than the width of the first end 401, the first electroplated copper wiring 42 can be firmly held above the base layer 10 by the second end 402 of the first bottom wiring 40, preventing separation of the first electroplated copper wiring 42 from the base layer 10.

In an embodiment, a dry film (not shown) may cover the first bottom wiring 40. The dry film defines openings for exposing the second end 402 of the first bottom wiring 40. A width of the openings is slightly greater than the width of the second end 402. Then, copper is electroplated into the openings of the dry film to obtain the first electroplated copper wiring 42. Since the width of the openings is slightly greater than the width of the second end 402, the first electroplated copper wiring 42 covers the second end 402, and at the same time it covers the first sidewall 403 of the first bottom wiring 40.

Since the copper is not electroplated on the whole surface of the board, so there is no need to etch the first electroplated copper wiring 42 afterwards, which saves the costs of raw material.

In an embodiment, a line width L of the first wiring layer 44 is less than 20 microns. A line space S of the first wiring layer 44 is less than 20 microns. In another embodiment, the first wiring layer 44 may also have a fatter line space, for example, the line space S may also be greater than 1000 microns.

Figure 7:
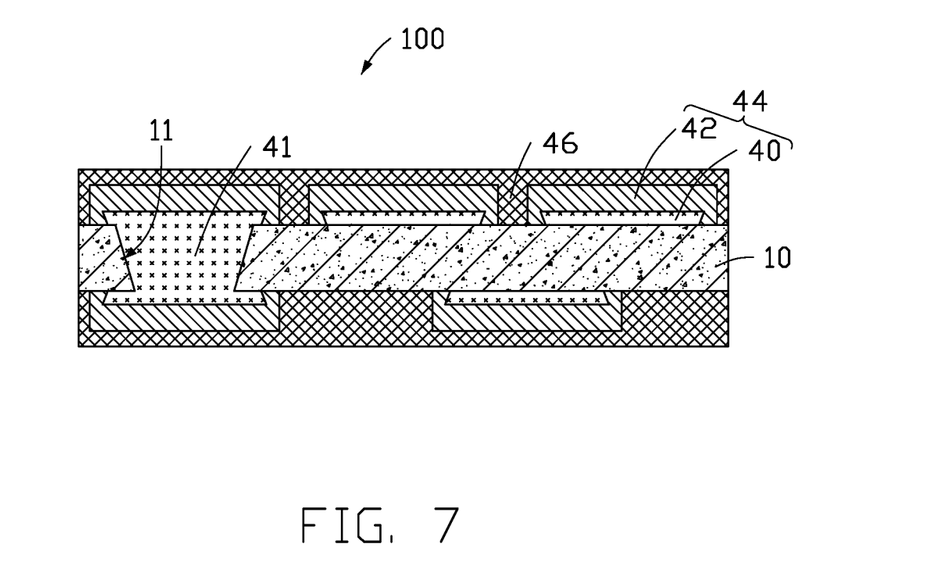
FIG. 7 is a cross-sectional view showing a first protection layer covering the first wiring layer of FIG. 6, to obtain a double-sided circuit board.

In block 106, referring to FIG. 7, a first protection layer 46 covers each first wiring layer 44 to obtain a circuit board 100 (in the embodiment, the circuit board 100 is a double-sided circuit board).

In an embodiment, the first protection layer 46 may be a solder resist layer or a cover film (CVL), for example, the first protection layer 46 may include a solder resist ink. The first protection layer 46 prevents oxidation of the first wiring layer 44. Short-circuiting during soldering of the first wiring layer 44 is also avoided.

Figure 16:
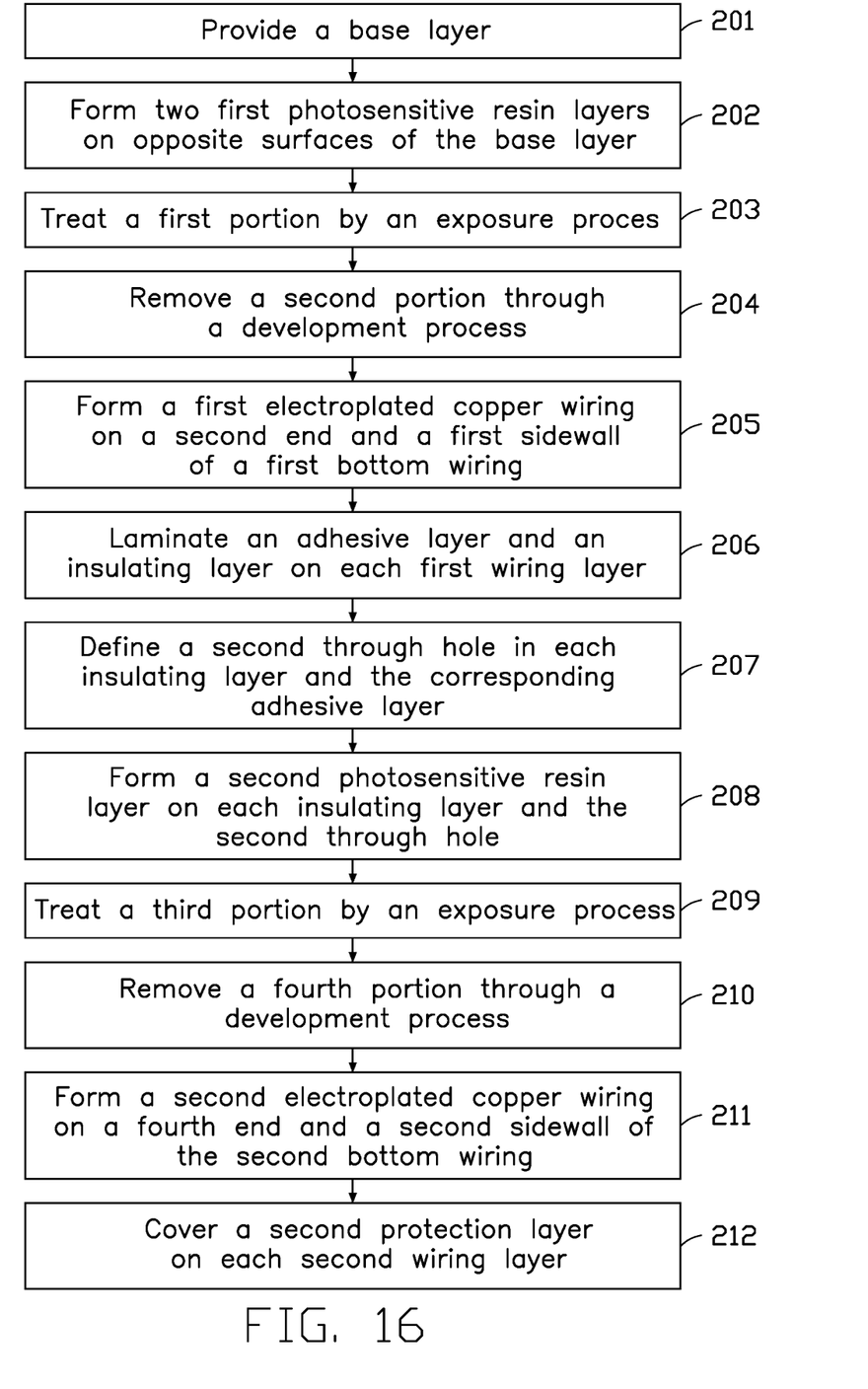
FIG. 16 is a flowchart of another embodiment of a method or manufacturing a multilayer circuit board.

Another embodiment of the method for manufacturing a multilayer circuit board is presented. The method is provided by way of example, as there are a variety of ways to carry out the method. Referring to FIG. 16, the first wiring layers 44 are formed on the base layer 10 by blocks 201-205, which are similar to those of blocks 101-105 (referring to FIGS. 1 to 6). After the first wiring layers 44 are obtained, the method can proceed at block 206.

Figure 8:
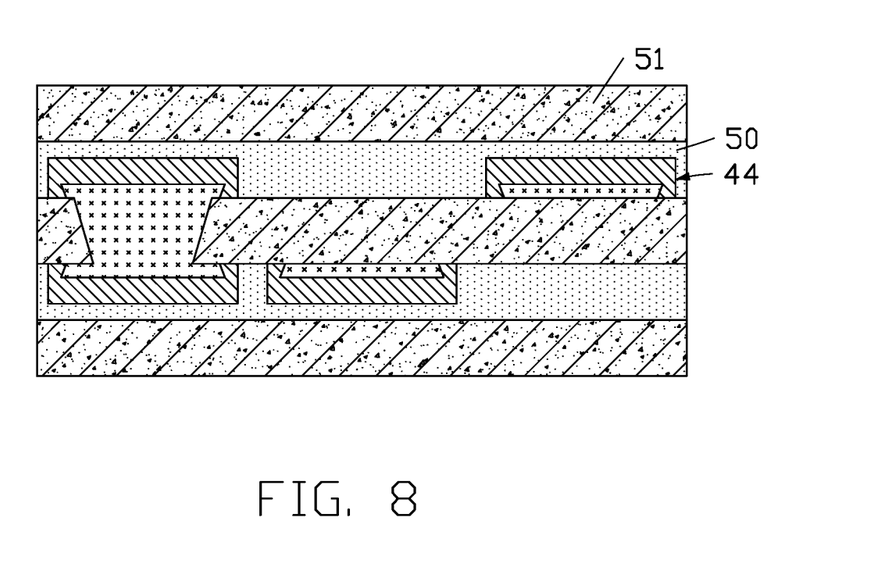
FIG. 8 is a cross-sectional view showing an adhesive layer and an insulating layer laminated on the first wiring layer of FIG. 6, in another embodiment.

In block 206, referring to FIG. 8, an adhesive layer 50 and the insulating layer 51 are laminated on each first wiring layer 44. The adhesive layer 50 is disposed between the insulating layer 51 and the first wiring layer 44.

In an embodiment, the insulating layer 51 is made of an insulating resin, such as epoxy resin, polypropylene, BT resin, polyphenylene ether, polypropylene, polyimide, polyester, ethylene phthalate, and polyethylene naphthalate. The insulating layer 51 can be made of same material as that of the base layer 10. The insulating layer 51 may also be made of a material which is diffferent from that of the base layer 10.

Figure 9:
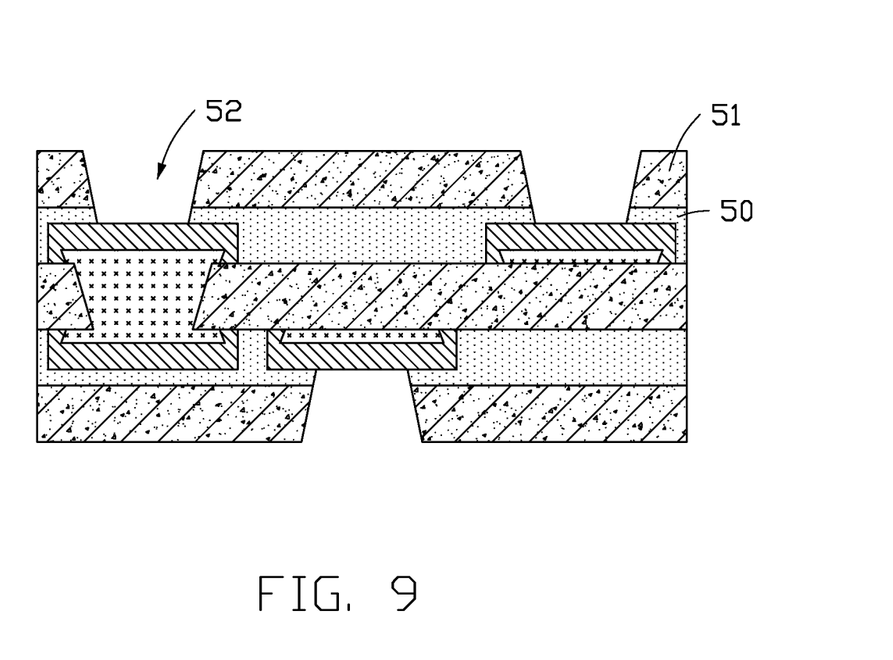
FIG. 9 is a cross-sectional view showing a through hole defined in the adhesive layer and the insulating layer of FIG. 8.

In block 207, referring to FIG. 9, a second through hole 52 is defined in each insulating layer 51 and the corresponding adhesive layer 50.

The second through hole 52 can be formed by punching or laser drilling.

Figure 10:
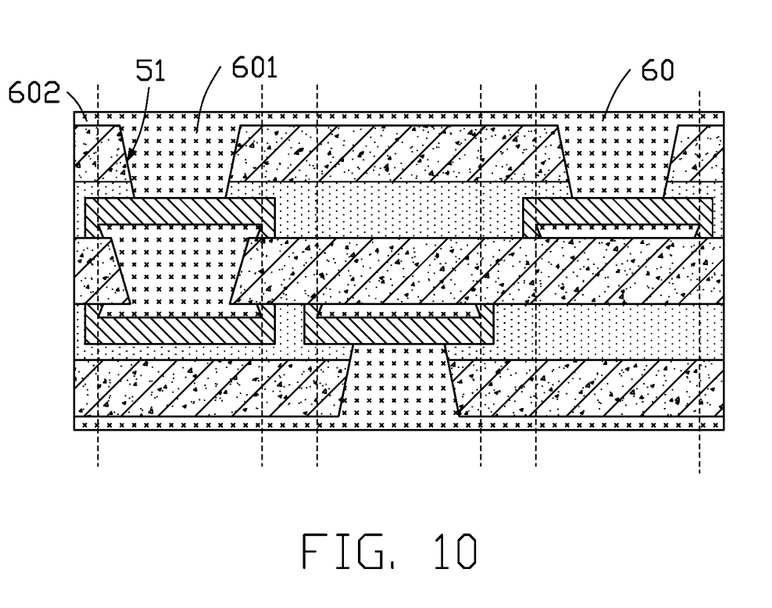
FIG. 10 is a cross-sectional view showing a second photosensitive resin layer formed on the insulating layer of FIG. 9.

In block 208, referring to FIG. 10, a second photosensitive resin layer 60 is formed on each insulating layer 51 and the second through hole 52. Each second photosensitive resin layer 60 includes a photosensitive resin and silver particles disposed in the photosensitive resin. Each second photosensitive resin layer 60 is divided into a third portion 601 corresponding to the second through hole 52 and a fourth portion 602 beside the third portion 601.

The third portion 601 is designed to correspond to the desired wiring patterns.

Figure 11:
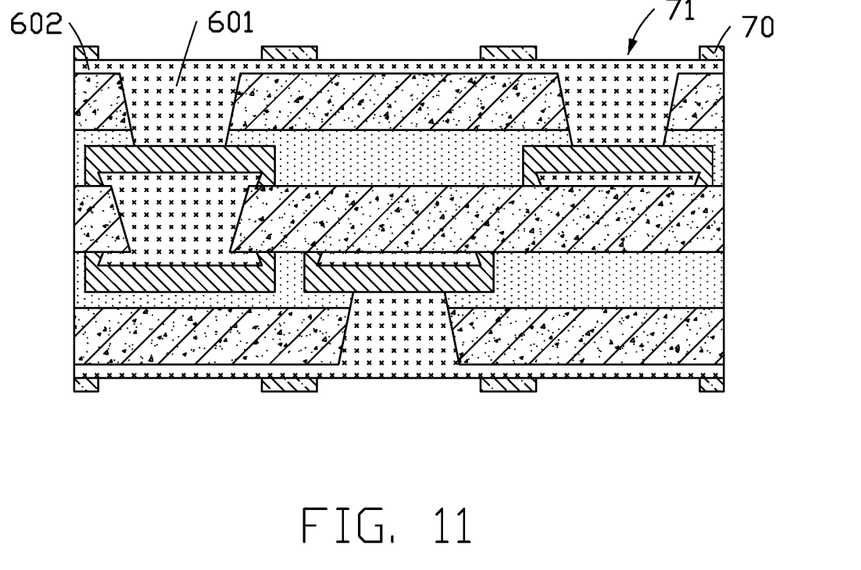
FIG. 11 is a cross-sectional view of the second photosensitive resin layer of FIG. 10 after an exposure process.

In block 209, referring to FIG. 11, the third portion 601 is treated by an exposure process.

In an embodiment, a second photomask 70 covers each second photosensitive resin layer 60. The second photomask 70 defines second openings 71 corresponding to the third portion 601. That is, the third portion 601 is exposed from the second photomask 70. The fourth portion 602 is covered by the second photomask 70. Therefore, when light irradiates the second photosensitive resin layer 60, compositions in the third portion 601 are polymerized under the light, causing solidification of the third portion 601. Compositions in the fourth portion 602 are not polymerized since the fourth portion 602 is not irradiated by the light (that is, the fourth portion 602 remains unsolidified).

Figure 12:
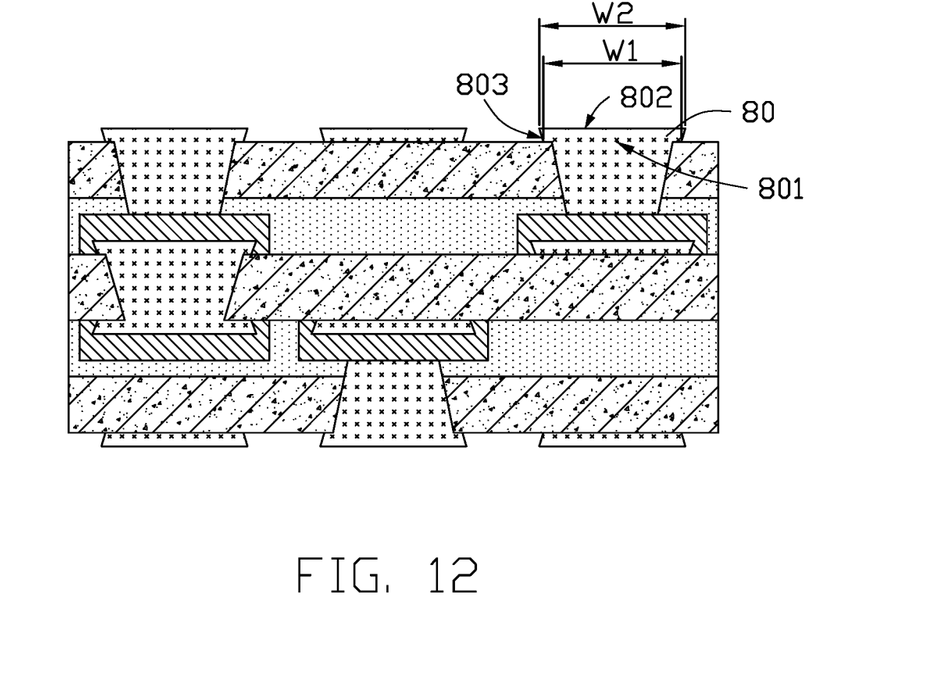
FIG. 12 is a cross-sectional view of the second photosensitive resin layer of FIG. 11 after a development process, to obtain a second bottom wiring.

In block 210, referring to FIG. 12, the fourth portion 602 is removed through a development process. After drying, two second bottom wiring 80 are obtained. Each second bottom wiring 80 includes a third end 801 facing the base layer 10, a fourth end 802 opposite to the third end 801, and a second sidewall 803 connecting the third end 801 and the fourth end 802.

In an embodiment, a width $W_4$ of the fourth end 802 is greater than a width $W_3$ of the third end 801. The width is defined as a dimension of the third end 801 or the fourth end 802 along the extending direction of the base layer 10.

The fourth portion 602 can be removed by an alkaline developing solution. The developing solution can include 1% $NaCO_3$ by amount. The fourth portion 602 at least is immersed in the developing solution. Since the fourth portion 602 is not treated by the exposure process, the fourth portion 602 can react with the developing solution and be removed. The silver particles in the removed fourth portion 602 can be recycled and reused, saving the costs of raw material.

Figure 13:
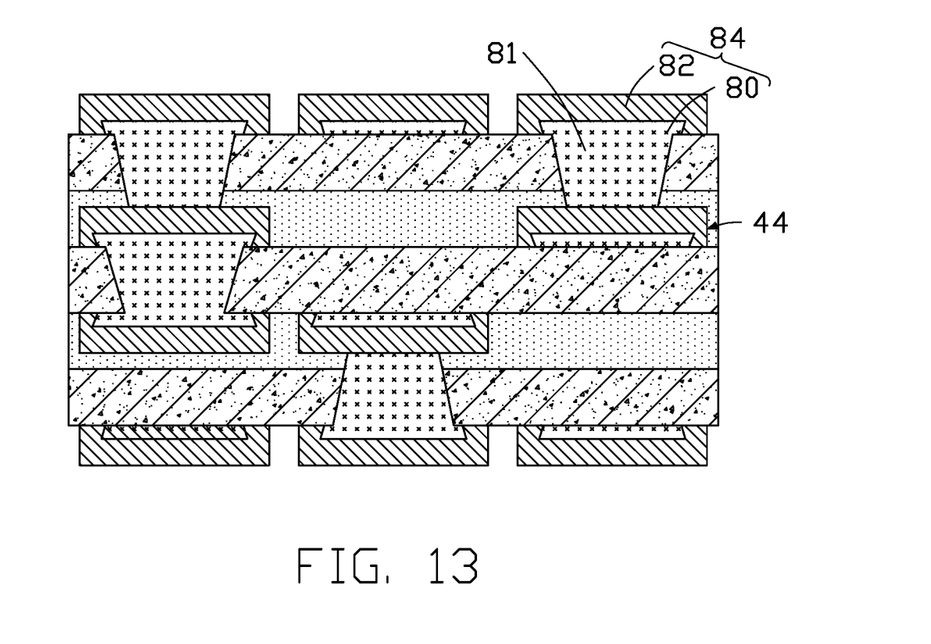
FIG. 13 is a cross-sectional view showing a second electroplated copper wiring formed on the second bottom wiring of FIG. 12, to obtain a second wiring layer.

In block 211, referring to FIG. 13, a second electroplated copper wiring 82 is formed on the fourth end 802 and the second sidewall 803 of the second bottom wiring 80, and the second bottom wiring 80 and the second electroplated copper wiring 82 cooperatively form a second wiring layer 84. The second bottom wiring 80 infills the second through hole 52 to form a second conductive block 81, which electrically connects the second wiring layer 84 to the first wiring layer 44. The second bottom wiring 80 includes the photosensitive resin and the silver particles disposed in the photosensitive resin. The silver particles render the second conductive block 81 electrically conductive.

Since the width of the fourth end 802 is greater than the width of the third end 801, the second electroplated copper wiring 82 can be firmly held above the base layer 10 by the fourth end 802 of the second bottom wiring 80, preventing separation of the second electroplated copper wiring 82 from the base layer 10.

In an embodiment, a dry film (not shown) may cover the second bottom wiring 80. The dry film defines openings for exposing the fourth end 802 of the second bottom wiring 80. A width of the opening is slightly greater than the width of the fourth end 802. Then, copper is electroplated in the openings of the dry film to obtain the second electroplated copper wiring 82. Since the width of the openings is slightly greater than the width of the fourth end 802, the second electroplated copper wiring 82 covers the fourth end 802, and at the same time covers the second sidewall 803 of the second bottom wiring 80.

Since copper is not electroplated on the whole surface of the board, so there is no need to etch the second electroplated copper wiring 82 afterwards, which saves the costs of raw material.

In an embodiment, a line width of the second wiring layer 84 is less than 20 microns. A line space of the second wiring layer 84 is less than 20 microns. In another embodiment, the second wiring layer 84 may also have a larger line space, for example, the line space may also be greater than 1000 microns.

Figure 14:
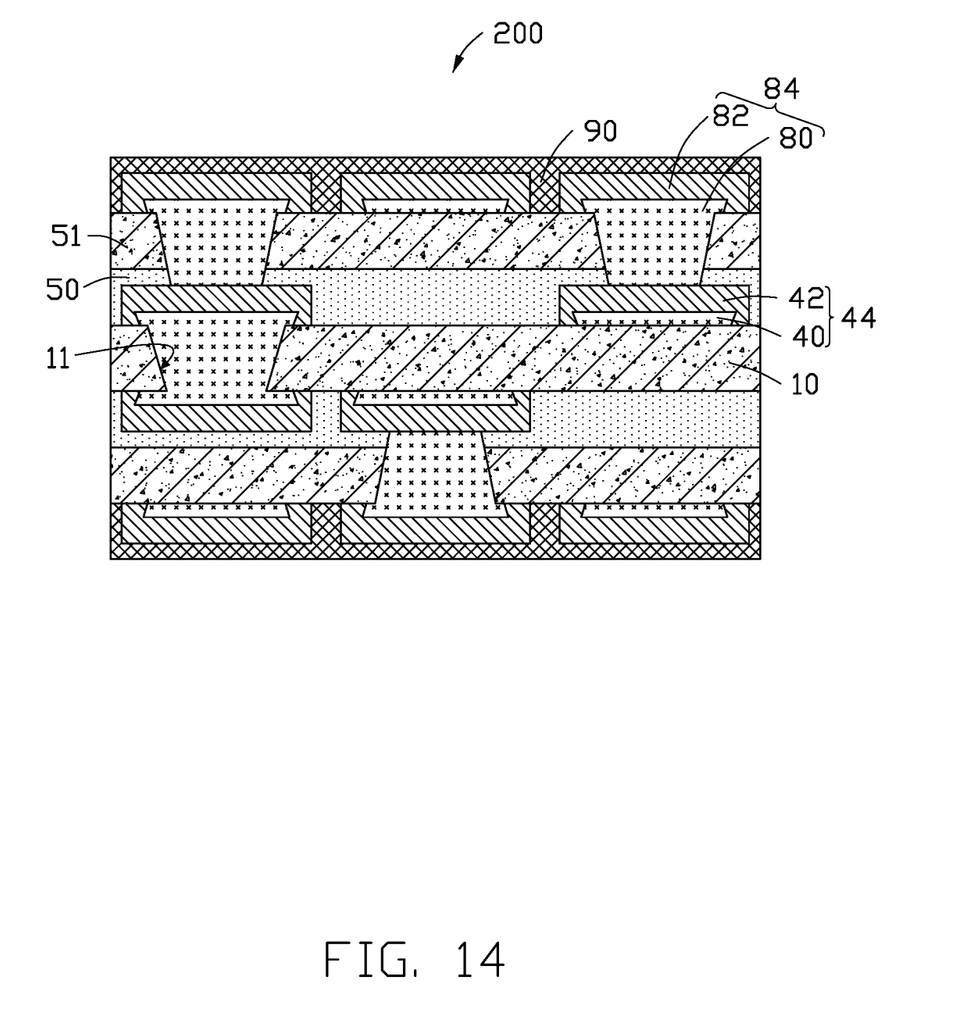
FIG. 14 is a cross-sectional view showing a second protection layer formed on the second wiring layer of FIG. 13, to obtain a multilayer circuit board.

In block 212, referring to FIG. 14, a second protection layer 90 covers each second wiring layer 84 to obtain a circuit board 200 (in the embodiment, the circuit board 200 is a multilayer circuit board).

In an embodiment, the second protection layer 90 may be a solder resist layer or a cover film (CVL). The second protection layer 90 prevents oxidation of the second wiring layer 84. Short-circuiting during soldering of the second wiring layer 84 is also avoided.

FIG. 7 illustrates an embodiment of a circuit board 100, including a base layer 10 and two first wiring layers 44 disposed on opposite surfaces of the base layer 10. Each first wiring layer 44 includes a first bottom wiring 40 disposed on the base layer 10. Each first bottom wiring 40 includes a first end 401 facing the base layer 10, a second end 402 opposite to the first end 401, and a first sidewall 403 connecting the first end 401 and the second end 402. In an embodiment, a width $W_2$ of the second end 402 is greater than a width $W_1$ of the first end 401. Each first wiring layer 44 further includes a first electroplated copper wiring 42. The first electroplated copper wiring 42 is disposed on the second end 402 and the first sidewall 403 of the first bottom wiring 40.

The base layer 10 defines a first through hole 11 penetrating the base layer 10. The first bottom wiring 40 also infills the first through hole 11 to form a first conductive block 41, which electrically connects the two first wiring layers 44 together.

In an embodiment, the circuit board 100 may also include a first protection layer 46 covering each first wiring layer 44.

FIG. 14 illustrates another embodiment of a circuit board 200, including a base layer 10 and two first wiring layer 44 disposed on opposite surfaces of the base layer 10. Each first wiring layer 44 includes a first bottom wiring 40 disposed on the base layer 10. Each first bottom wiring 40 includes a first end 401 facing the base layer 10, a second end 402 opposite to the first end 401, and a first sidewall 403 connecting the first end 401 and the second end 402. In an embodiment, a width $W_2$ of the second end 402 is greater than a width $W_1$ of the first end 401. Each first wiring layer 44 further includes a first electroplated copper wiring 42. The first electroplated copper wiring 42 is disposed on the second end 402 and the first sidewall 403 of the first bottom wiring 40.

The circuit board 200 further includes an adhesive layer 50 and an insulating layer 51 sequentially disposed on each of the first wiring layers 44. Each insulating layer 51 and the corresponding adhesive layer 50 define a second through hole 52.

The circuit board 200 further includes a second wiring layer 84 disposed on each insulating layer 51. Each second wiring layer 84 includes a second bottom wiring 80 disposed on the insulating layer 51. The second bottom wiring 80 includes a third end 801 facing the base layer 10, a fourth end 802 opposite to the third end 801, and a second sidewall 803 connecting the third end 801 and the fourth end 802. In an embodiment, a width $W_4$ of the fourth end 802 is greater than a width $W_3$ of the third end 801. Each second wiring layer 84 also includes a second electroplated copper wiring 82 disposed on the fourth end 802 and the second sidewall 803 of the second bottom wiring 80. The second bottom wiring 80 further infills the second through hole 52 to form a second conductive block 81, which electrically connects the second wiring layer 84 to the first wiring layer 44.

In an embodiment, the circuit board 200 may further include a second protection layer 90 disposed on each second wiring layer 84.

The method of the present disclosure manufactures a circuit board with fine and narrow wiring patterns. The electroplated copper disposed on the bottom wiring decreases the resistance of the wiring patterns. The method does not electroplate copper on the whole surface of the board, so there is no need to etch the electroplated copper afterwards, and pollution by the etched electroplated copper is reduced. Moreover, the silver particles in the removed photosensitive resin layer after the development process can be recycled and reused, saving the costs of raw material.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board, comprising:
   providing a base layer;
   forming two first photosensitive resin layers on opposite surfaces of the base layer, each first photosensitive resin layer comprising a photosensitive resin and a conductive material disposed in the photosensitive resin, each first photosensitive resin layer being divided into a first portion and a second portion beside the first portion;
   treating the first portion through an exposure process;
   removing the second portion through a development process, thereby obtaining a first bottom wiring, each first bottom wiring comprising a first end facing the base layer, a second end opposite to the first end, and a first sidewall connecting the first end and the second end; and
   forming a first electroplated copper wiring on the second end and the first sidewall of each first bottom wiring, and each first bottom wiring and the corresponding first electroplated copper wiring cooperatively forming a first wiring layer.

2. The method of claim 1, wherein a width of the second end is greater than a width of the first end.

3. The method of claim 1, further comprising:
   defining a first through hole in the base layer;
   wherein at least one of the first photosensitive resin layers is filled in the first through hole to form a first conductive block, which electrically connects the two first wiring layers to each other.

4. The method of claim 3, further comprising:
   laminating an adhesive layer and an insulating layer on each first wiring layer, the adhesive layer disposed between the insulating layer and the first wiring layer;
   defining a second through hole in each insulating layer and the corresponding adhesive layer;
   forming a second photosensitive resin layer on each insulating layer, the second photosensitive resin layer comprising a photosensitive resin and a conductive material disposed in the photosensitive resin, the photosensitive resin layer being divided into a third portion corresponding to the second through hole and a fourth portion beside the third portion;
   treating the third portion through an exposure process;
   removing the fourth portion through a development process to obtain a second bottom wiring, each second bottom wiring comprising a third end facing the base layer, a fourth end opposite to the third end, and a second sidewall connecting the third end and the fourth end; and
   forming a second electroplated copper wiring on the fourth end and the second sidewall of the second bottom wiring, the second bottom wiring and the second electroplated copper wiring cooperatively forming a second wiring layer.

5. The method of claim 4, wherein the second photosensitive resin layer is further filled in the second through hole to form a second conductive block, which electrically connects the two first wiring layers together.

6. The method of claim 1, wherein a line width of the first wiring layer is less than 20 microns, and a line space of the first wiring layer is less than 20 microns or greater than 1000 microns.

7. The method of claim 1, further comprising:
   covering a protective layer on each first wiring layer.

8. The method of claim 1, wherein the conductive material comprises at least one of silver particle, copper particle, graphene, and carbon nanotube.

* * * * *